(12) United States Patent
Kanda et al.

(10) Patent No.: US 7,122,087 B2
(45) Date of Patent: Oct. 17, 2006

(54) METHOD OF MANUFACTURING RFID (75) Inventors: Naoya Kanda, Fujisawa (JP); Kosuke Inoue, Fujisawa (JP); Madoka Minagawa, Yokohama (JP); Shigeharu Tsunoda, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/985,934

(22) Filed: Nov. 12, 2004

(65) Prior Publication Data
US 2005/0130425 A1 Jun. 16, 2005

(30) Foreign Application Priority Data
Nov. 12, 2003 (JP) ............................. 2003-381954
Aug. 11, 2004 (JP) ............................. 2004-234016

(51) Int. Cl.
*B32B 37/00* (2006.01)
(52) U.S. Cl. .................................. 156/73.1; 228/110.1
(58) Field of Classification Search ............... 156/73.1, 156/308.2, 308.4, 580.1, 580.2; 228/1.1, 228/110.1; 264/442, 443, 444, 445
See application file for complete search history.

(56) References Cited

U.S. PATENT DOCUMENTS 6,406,990 B1 * 6/2002 Kawai ........................ 438/612
6,523,734 B1 * 2/2003 Kawai et al. ............ 228/110.1

FOREIGN PATENT DOCUMENTS
JP 2003-203946 7/2003

\* cited by examiner

*Primary Examiner*—James Sells
(74) *Attorney, Agent, or Firm*—Antonelli, Terry, Stout and Kraus, LLP.

(57) ABSTRACT

There is a method of manufacturing an RFID, in which a semiconductor chip with a memory is bonded to an antenna, so that the information recorded in the memory can be transmitted through the antenna. In the RFID, a PET film, a PEN film, or a sheet of paper is used as the base material of the antenna. The method includes: aligning the semiconductor chip with gold bumps relative to the antenna, in which a metal foil formed of an aluminum or an aluminum alloy is adhered to the base material, including a polyethylene terephthalate or a polyethylene naphthalate; pressing the semiconductor chip to the antenna; and applying ultrasonic waves under an ambient temperature lower than the glass transition temperature of the polyethylene terephthalate or the polyethylene naphthalate, to thereby bond the gold bumps and the metal foil. Thus, the method suppresses the deformation of the antenna.

19 Claims, 6 Drawing Sheets

METHOD OF MANUFACTURING RFID

CROSS REFERENCE TO RELATED APPLICATIONS

The disclosure of Japanese Patent Application No. 2003-381954, filed on Nov. 12, 2003, including the specification, drawings and abstract thereof, is incorporated herein by reference in its entirety.

The disclosure of Japanese Patent Application No. 2004-234016, filed on Aug. 11, 2004, including the specification, drawings and abstract thereof, is incorporated herein by reference in its entirety.

BACKGROUND OF THE INVENTION

The present invention relates to a method of manufacture of an RFID, in which a semiconductor chip having individual identifying information stored in a memory is bonded to an antenna member.

A conventional method of manufacture of an RFID is disclosed in Japanese Unexamined Application JP2003-203946(A). According to the method of manufacture disclosed in this document, first, an un-annealed aluminum foil is placed on one side of a PET (polyethylene terephthalate) film, with the intervention of a urethane resin adhesive, which is bonded to form a laminated structure through a thermal lamination process under the condition of 150° C. and 5 kg/cm$^2$, and, thereby, a metal foil laminated material is manufactured. Further, the metal foil laminated material is overlaid with a thermoplastic resin adhesive. And, ultrasonic vibrations are applied to a semiconductor bare chip with gold bumps to further heat it to 150° C., and the semiconductor bare chip is bonded to the metal foil of the metal foil laminated material that is covered with the thermoplastic resin adhesive.

The method of manufacture disclosed in the above-referenced document disregards the influence of the temperature on the metal foil laminated material during the mounting of the semiconductor chip. In this regard, the glass transition temperature of the PET is 60° C.~80° C. in general, and, when the temperature of the PET film exceeds this glass transition temperature, the PET film becomes rubbery.

The above-referenced document discloses the ultrasonic bonding of a metal foil adhered to the PET film and the semiconductor chip under the ambient temperature of 150° C.; accordingly, the PET film softens like a rubber material during the bonding. When the PET film softens, the metal foil is deformed. If the metal foil undergoes a serious deformation, the metal foil will be peeled off or short-circuited, which possibly gives an undesirable deviation to the frequency characteristic of the antenna. This problem develops when using a PEN (polyethylene naphthalate) film or a sheet of paper as the base material, although the temperature and the degree of deformation are different.

Therefore, an object of the present invention is to provide an RFID in which deformation of an antenna having a low heat resistance property is reduced.

SUMMARY OF THE INVENTION

It is generally understood that ultrasonic bonding involves heating. However, to overcome the above-mentioned problem, the inventors of the present invention have examined metal foil materials and bump materials that do not need special heating, and which permit bonding to occur under a normal temperature. As a result of this examination, it has been found that the ultrasonic bonding of aluminum material and gold does not need a high temperature, and the mounting of a semiconductor chip through ultrasonic bonding is possible with such materials under normal temperature, namely, at the temperature of the room where the manufacturing devices are installed.

Accordingly, the inventors have determined that it is possible to use an aluminum system material with a low heat resistance for the antenna on which a semiconductor chip is mounted, and gold for the bumps, and to apply ultrasonic waves under the conditions of a room temperature lower than the glass transition temperature and a pressure applied to the antenna from above the semiconductor chip.

The method is remarkably effective in solving the above-stated problem, especially in a case wherein a PET or PEN film is used as the base material of a metal foil, which serves as the antenna.

Also, when a sheet of paper is used as the base material, the method attains the same effect, since it is likely to be deformed and burned under conventional conditions.

DETAILED DESCRIPTION OF THE PREFERRED EMBODIMENTS

The preferred embodiments of the present invention relating to a method of manufacture of an the RFID will now be described.

[Embodiment 1]

Figure 1:
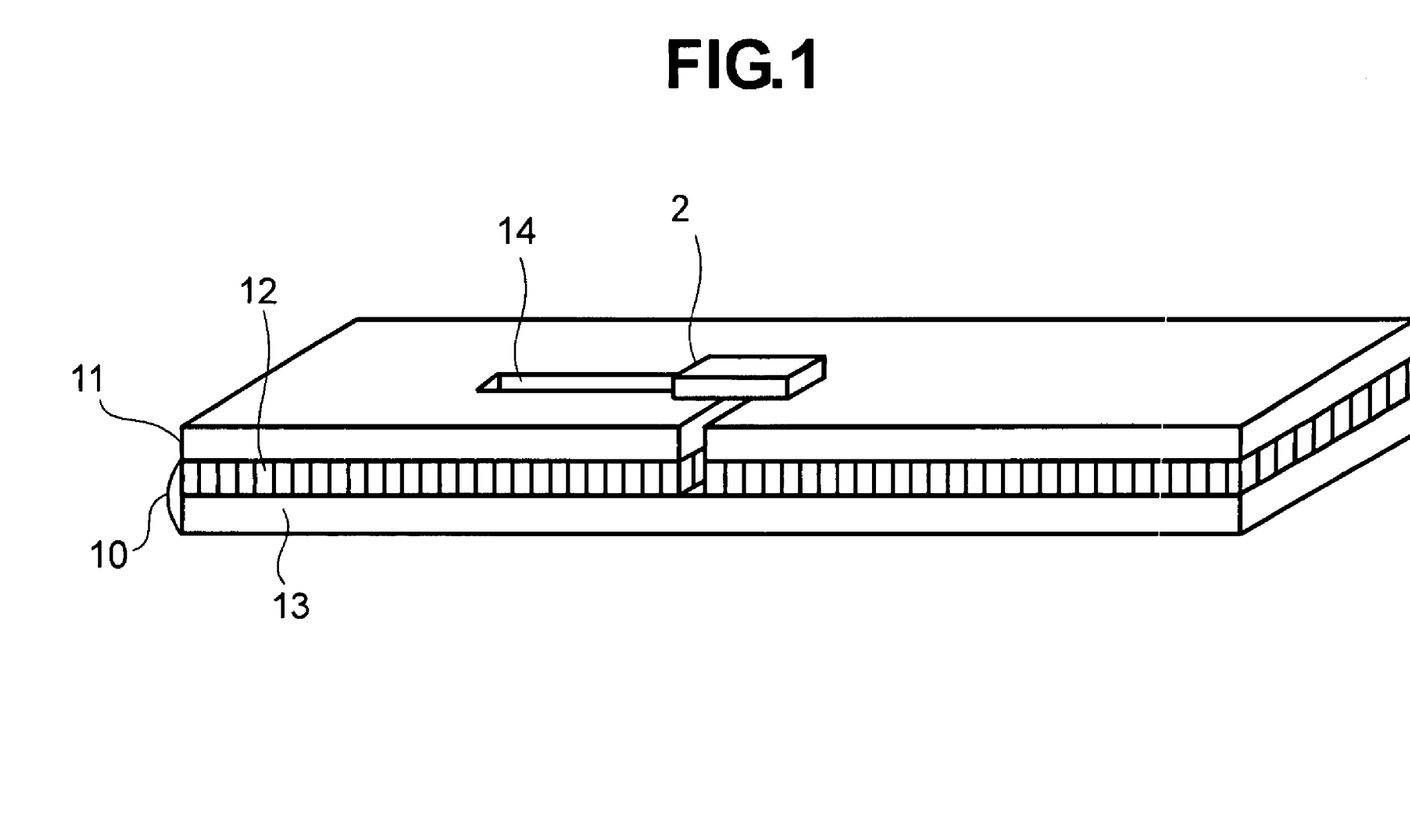
FIG. 1 is a perspective view which illustrates the structure of an RFID.

FIG. 1 illustrates a perspective view of the RFID. The RFID 1 consists of a semiconductor chip 2, a metal foil laminated member 10, and a resin layer 11 serving as a cover layer and an etching resist layer. The semiconductor chip 2 is formed in a square shape with 400 µm an each side, and it is provided with four circular gold bumps on the device side, the pitch of which is 300 µm and the diameter of which is 63 µm.

The metal foil laminated member 10 is composed of a metal foil (aluminum foil) 12 and a PET film 13, and the aluminum foil 12 is bonded to the PET film 13. The aluminum foil 12 is fabricated into a form capable of transmitting and receiving radio waves at the frequency of 2.45 GHz. The PET film 13 is the base material of the metal foil, and it is formed by extending a polyethylene terephthalate material. And, the metal foil 12 is configured in the shape of a rectangle provided with an L-letter shaped gap.

Figure 4:
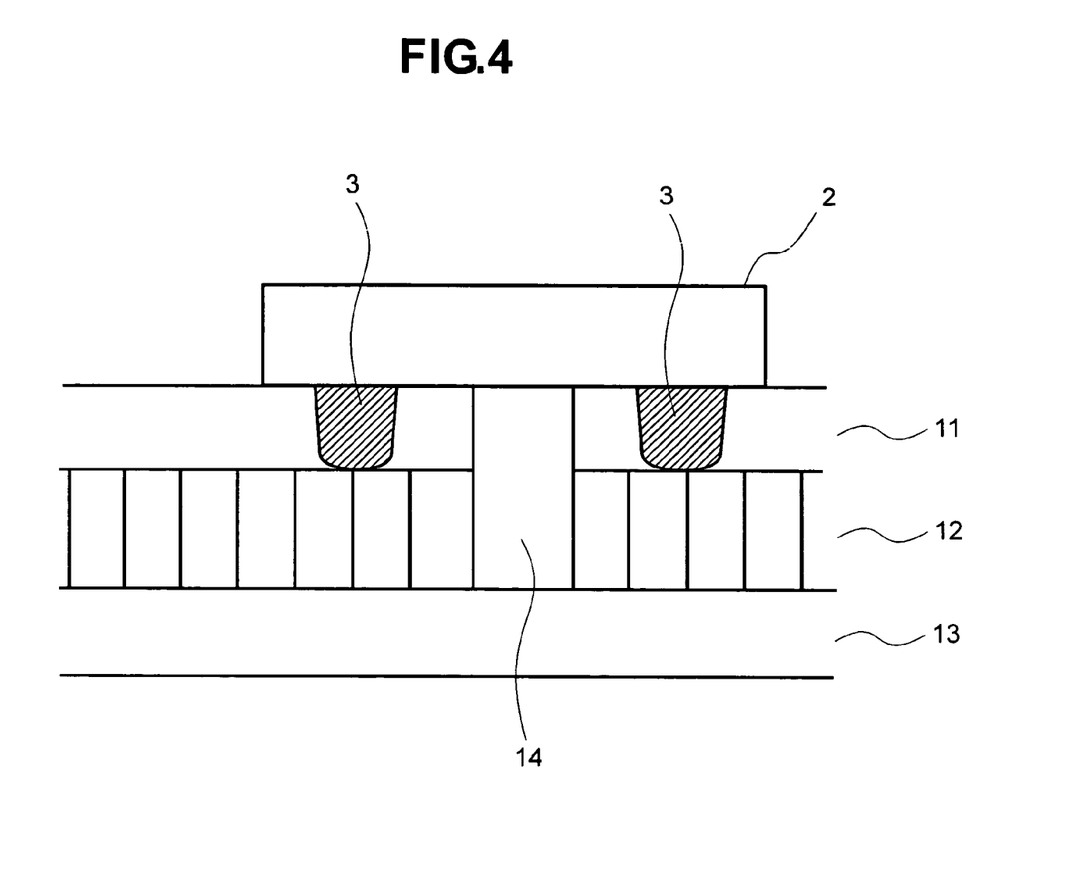
FIG. 4 is an enlarged diagrammatic side view of the RFID in a part where the semiconductor chip is mounted.

FIG. 4 illustrates the state of this bonding. The metal bumps 3 are electrically connected to the metal foil 12. The resin layer 11 surrounds the gold bumps 3 of the semiconductor chip 2.

Figure 2:
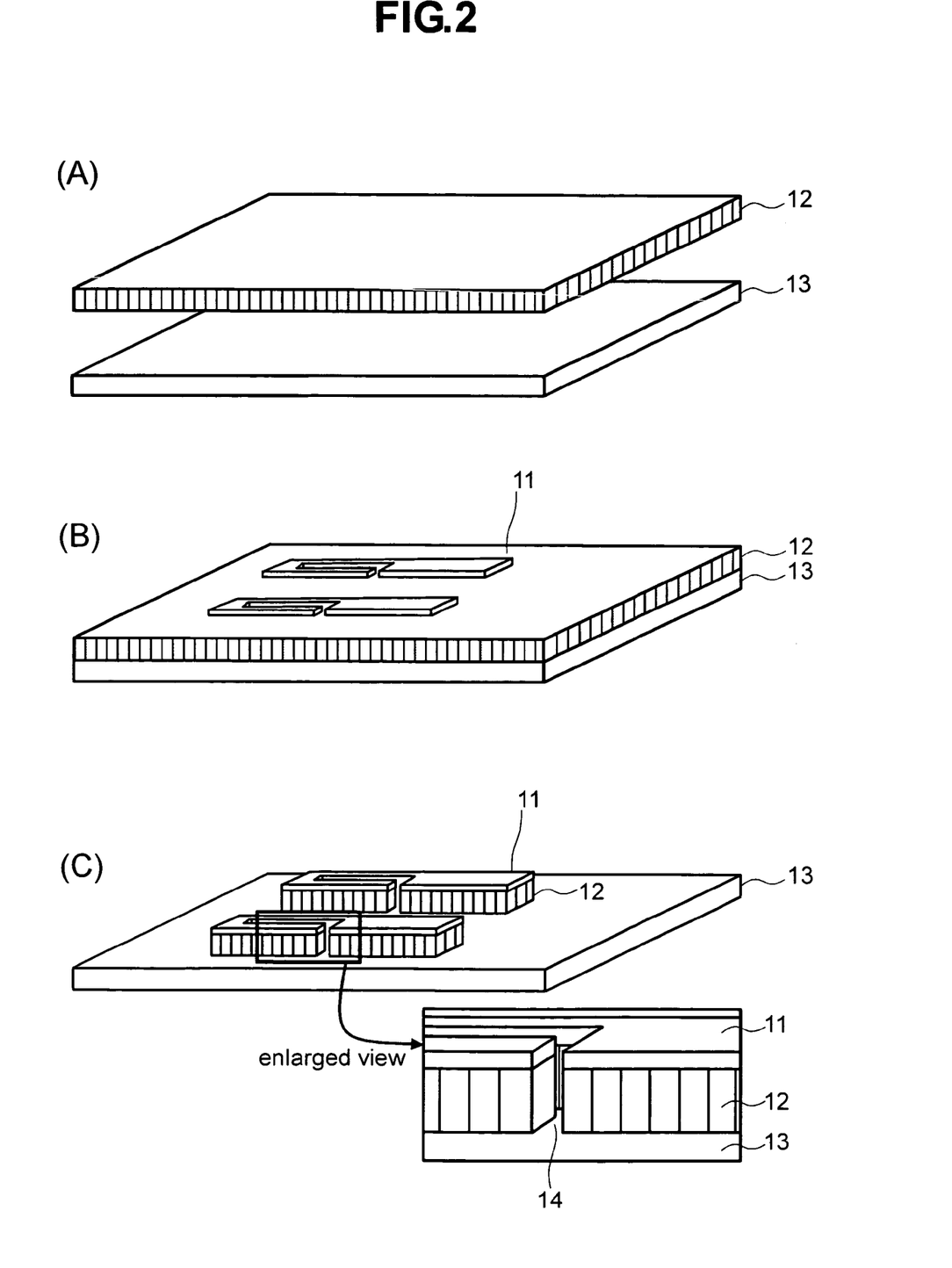
FIG. 2 is a process flow diagram which illustrates the manufacturing flow.
Figure 3:
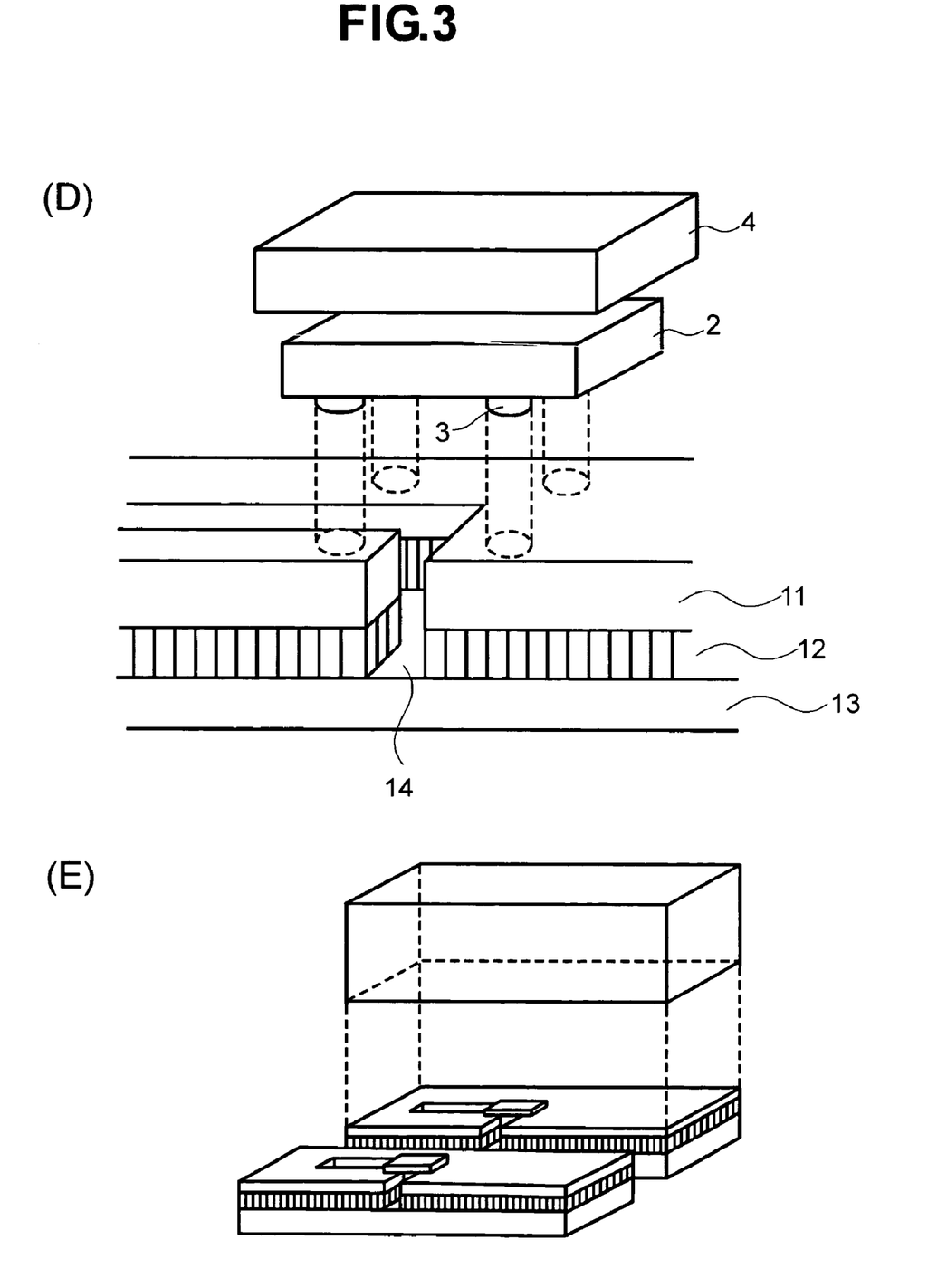
FIG. 3 is a process flow diagram which illustrates the manufacturing flow.

FIG. 2 and FIG. 3 illustrate the manufacturing flow of this RFID.

The RFID illustrated in FIG. 1 is manufactured according to the following order of processes: (A) a process for the manufacture of the metal foil laminated member, (B) a resin layer forming process, (C) a process for the manufacture of the antenna pattern, (D) an ultrasonic applying process, and (E) an inlet individualizing process.

(A) Process for the Manufacture of the Metal Foil Laminated Member

First, it is necessary to prepare an aluminum foil 12 with thickness of 20 μm and a PET film 13 with a thickness of 25 μm.

Next, the process disposes the aluminum foil 12 on one side (on the upper side in the drawing) of the PET film 13 with an adhesive disposed between them, and it applies a temperature of 150° C. and a pressure of 5 kg/cm² to the adhered lamination, thereby forming the metal foil laminated member 10 in which the metal foil is adhered to the PET film.

(B) A Resin Layer Forming Process

This process forms the resin layer 11 having a thickness of about 4~6 μm on the surface of the aluminum foil 12 of the metal foil laminated member 10 that was fabricated in the process (A). The resin layer 11 is fabricated to have a required antenna pattern by means of photogravure. The material for this resin layer 11 is one that functions as a resist layer when the next process etches the aluminum foil 12.

This resin layer 11 also may be formed by means of the so-called general photo etching method that coats a photo-coagulative resin, cures the photo-coagulative resin using a mask into a specific pattern, and removes the remainder except for the specific pattern, instead of forming the pattern on the surface of the aluminum foil 12 of the metal foil laminated member 10 by means of photogravure. Here, the thickness of this coating is controlled according to the size or shape of the bumps of the chip to be mounted.

Although it is not adopted in this embodiment, another method is conceivable in which the PET film 13 is provided with sprocket perforations in the antenna pattern of the resin layer 11, or provides it in advance, and then forms the pattern of the resin layer 11 between the sprocket perforations. This method will permit a reel-to-reel production. Here, in case of forming the sprocket perforations in this process, it is preferable to form two rows of the resin layer 11 independent from the antenna pattern, so as to put in the pattern of the resin layer 11, and to punch the metal foil laminated member 10 from the side of the resin layer 11 using a puncher. This is because the resin layer 11 functions as a lubricant for the cutting edge of the puncher.

(C) Process for the Manufacture of the Antenna Pattern

Next, the etching treatment removes the area of the aluminum foil, being the part that is exposed from the resist layer of the antenna pattern of the resin layer 11. The etching forms the antenna. The etching is carried out, for example, by soaking the area of the aluminum foil that is exposed from the etching resist pattern 7 in a solution of NaOH (120 g/l), serving as the etching liquid, under a temperature of 50° C.

(D) An Ultrasonic Applying Process

First, this process aligns the semiconductor chip 2 at a predetermined position relative to a laminated structure of the resin layer 11 and the metal foil laminated member 10 in which the antenna pattern of the metal foil 12 is formed on the PET film 13 as the base material.

In this embodiment, the alignment is effected in a manner such that the center of the semiconductor chip 2 coincides with the corner of an L-letter shaped gap 14 formed on the metal foil 12 and the resin layer 11. That is, the structure is in a form such that the gap 14 is disposed between the four gold bumps 3. When arranging the signal bumps in a slant direction, and arranging one signal bump in the joint area of the gold bumps 3 in which two sides thereof are surrounded by the gap, this configuration secures electrical connections even if the other signal bump is dislocated slightly, thus increasing the margin of the alignment.

Next, the process presses the gold bumps 3 to the resin layer 11 with a specific pressure, puts a square horn 4 with 500 μm on each side on the upper side of the semiconductor chip 2, and applies ultrasonic waves 5 to the side of the semiconductor chip 2 where the gold bumps are not present.

By the application of ultrasonic vibrations, the gold bumps 3 displace the resin layer 11, so that the bumps come into contact and join with the aluminum foil 12. The temperature setting in this process is the room temperature, which is lower than the glass transition temperature of the PET film 13. And, the ultrasonic waves at a frequency of 63.5 KHz are applied at an output power of 2 Watts for a few seconds under the load pressure of 0.2 Kg/mm².

Although this embodiment applies the ultrasonic waves at room temperature, so long as the ambient temperature is lower than the glass transition temperature, heating at that temperature will not cause any difficulties.

Moreover, the above reference to "a few seconds" is not meant to exclude 1 second or less. From a viewpoint of preventing the antenna sensitivity and the junction reliability between an antenna and a semiconductor chips from falling, the most suitable conditions for applying ultrasonic vibration is a vibration for about 0.5 seconds with an output power of 1.2 Watts.

(E) Inlet Individualizing Process.

This process individualizes the RFID (inlet) mounting the semiconductor chip 2, by lowering a metal frame 20 from above the resin layer 11. Here, the size of the metal frame 20 is virtually the same as the size of the pattern of the resin layer 11 or the metal foil 12, namely, the antenna pattern, and the lower end thereof is formed as a sharp cutting edge.

This embodiment employs the PET film 13 as the base material of the laminated member 1. However, instead of employing the PET film 13, it is possible to employ a PEN (polyethylene naphthalate) film (film formed by extending a polyethylene naphthalate) or a mixed film (film formed by extending a mixed material of the PET and the PEN). In this case, the glass transition temperature of the general polyethylene naphthalate is about 100° C.~120° C., and the ambient temperature should be lower than this temperature.

The embodiment being thus described, when the antenna of an aluminum system metal (aluminum or aluminum alloy) foil is formed on the base material including a material such as a PET film, a PEN film, or a sheet of paper, (including the case in which the base material is composed of plural layers, and these materials are used in any one of the layers), the method of this embodiment is designed to mount a semiconductor chip on the aluminum system metal foil at a temperature lower than the deformable temperature, such as the glass transition temperature, of the base material, and with a desired pressure. That is, the method of this embodiment does not adopt the ultrasonic bonding technique under the conventional conditions of heating and pressurization; and, this method is able to suppress the deformation of the antenna accordingly.

[Embodiment 2]

Figure 5:
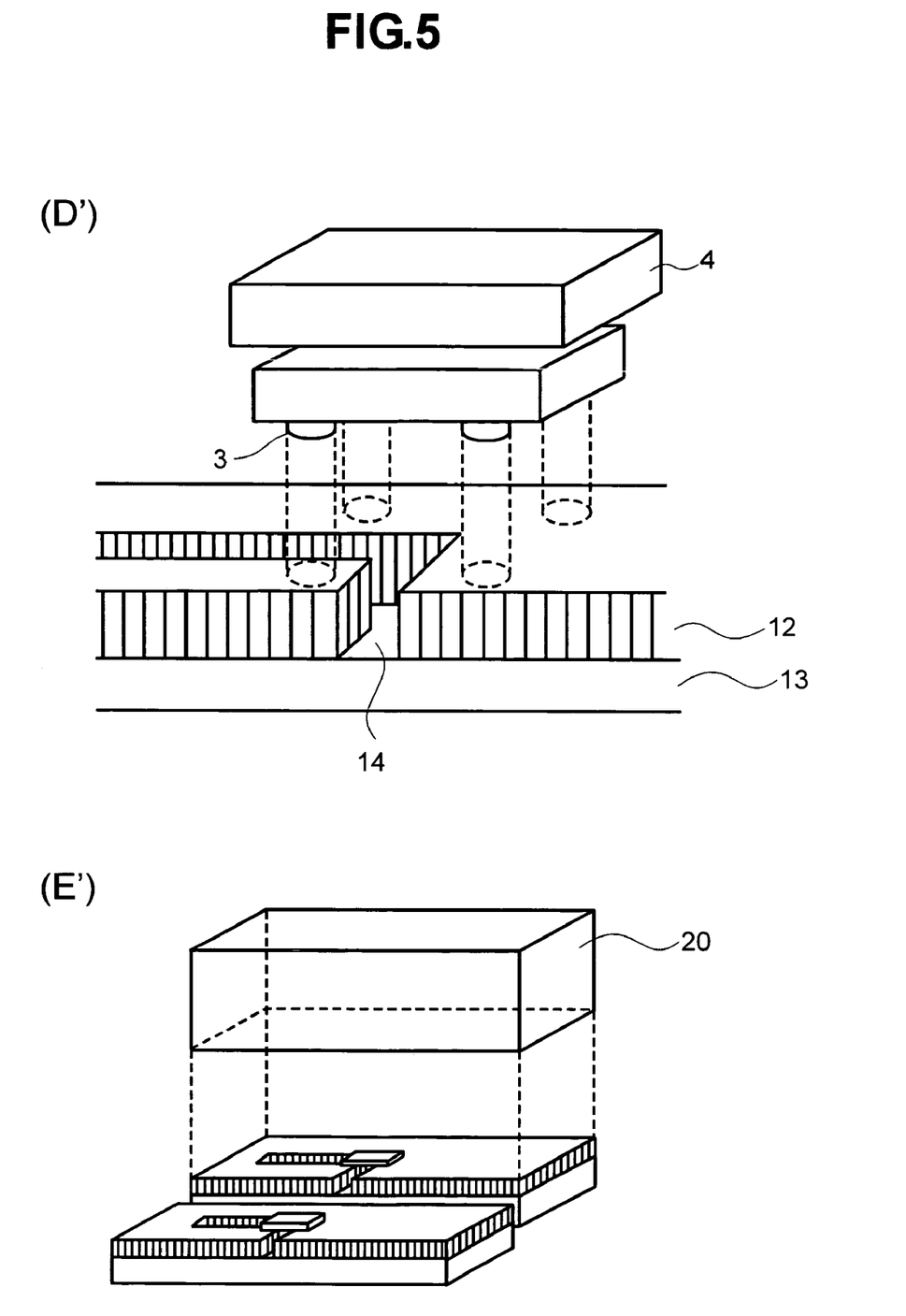
FIG. 5 is a process flow diagram which illustrates the manufacturing flow.
Figure 6:
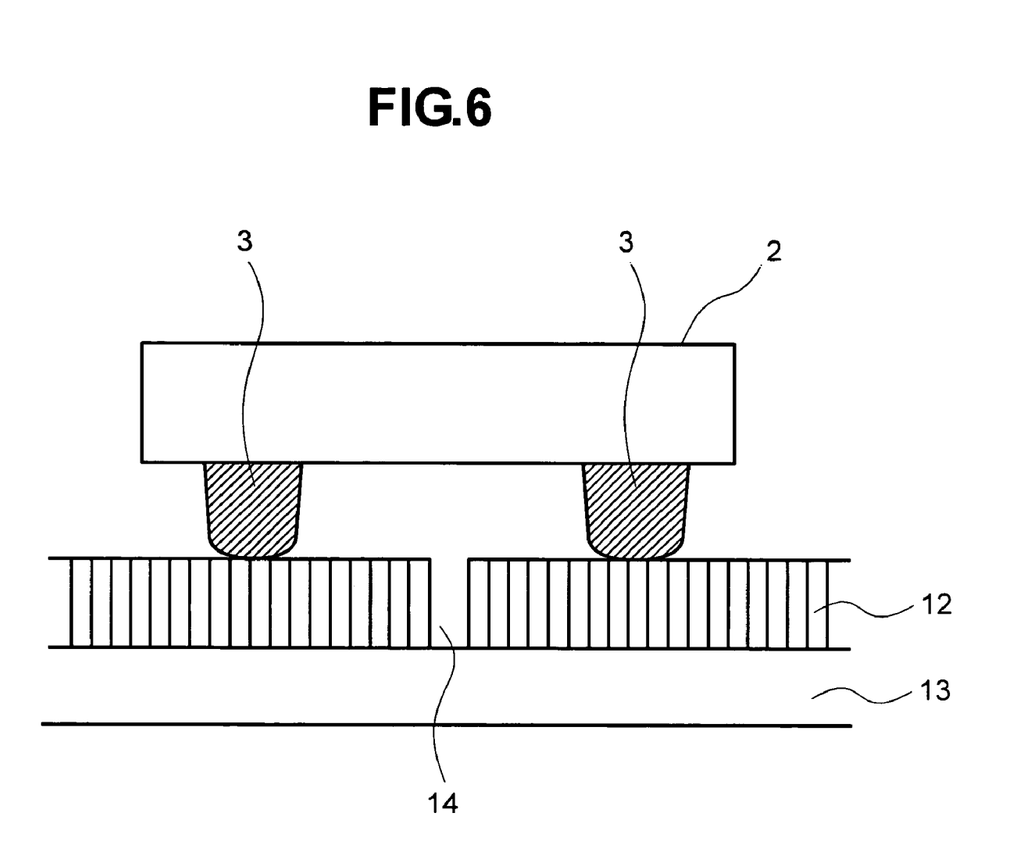
FIG. 6 is an enlarged diagrammatic side view of the RFID in a part where the semiconductor chip is mounted.

Another embodiment is shown in FIG. 5 and FIG. 6.

The process (C) of the embodiment 1 leaves the resin layer 11 of the antenna pattern as it is, but this embodiment removes the resin layer 11, as shown in FIG. 5 and FIG. 6. The method of removing it is the general photo etching process. This method makes it possible to manufacture a structure in which only the resin layer 11 of FIG. 1 is absent.

Thus, the manufacturing processes (C)~(E) are replaced by the following processes (C')~(E').

(C') Process for the Manufacture of the Antenna Pattern

The etching treatment removes the area of the aluminum foil, being the part that is exposed from the resist layer of the antenna pattern of the resin layer 11. This etching forms the antenna. The etching is carried out, for example, by soaking the area of the aluminum foil that is exposed from the etching resist pattern 7 in a solution NaOH (120 g/l), serving as the etching liquid, at a temperature of 50° C.

Thereafter, the pattern of the resin layer 11, having functioned as the resist layer, is removed by using a resist remover.

(D') Ultrasonic Applying Process

First, this process aligns the semiconductor chip 2 at a predetermined position relative to the metal foil laminated member 10 in which the antenna pattern of the metal foil 12 is formed on the PET film 13 as the base material.

In this embodiment, the alignment is effected in a manner such that the center of the semiconductor chip 2 coincides with the corner of the L-letter shaped gap 14 formed on the metal foil 12. That is, the structure is made in a form such that the gap 14 is disposed between the four gold bumps 3. When arranging the signal bumps in a slant direction, and arranging one signal bump in the joint area of the gold bumps 3 in which two sides thereof are surrounded by the gap, this configuration secures the electrical connection-seven if the other signal bump is dislocated slightly, thus increasing the margin of the alignment.

Next, the process presses the gold bumps 3 to the metal foil 12 with a specific pressure, puts a square horn 4 with 500 μm on each side on the upper side of the semiconductor chip 2, and applies ultrasonic waves 5 to the side of the semiconductor chip 2 where the gold bumps are not present.

By application of the ultrasonic vibrations, the gold bumps 3 displace the resin layer 11, so that the bumps come into contact and join with the aluminum foil 12. The temperature setting in this process is the room temperature, which is is lower than the glass transition temperature of the PET film 13. And, the ultrasonic waves at a frequency of 63.5 KHz are applied at an output power of 2 Watts for a few seconds under a load pressure 0.2 Kg/mm².

Although this embodiment applies the ultrasonic waves at room temperature, so long as the ambient temperature is lower than the glass transition temperature, heating at that temperature will not cause any difficulties.

Moreover, the above reference to "a few seconds" is not meant to exclude 1 second or less. From a viewpoint of preventing the antenna sensitivity and the junction reliability between an antenna and a semiconductor chip from failing, the most suitable conditions for applying ultrasonic vibration is vibration for about 0.5 seconds with an output power of 1.2 Watts.

(E') Inlet Individualizing Process.

This process individualizes the RFID (inlet) mounting the semiconductor chip 2 by lowering the metal frame 20 from above the metal foil 12. Here, the size of the metal frame 20 is virtually the same as the size of the pattern of the metal foil 12, namely, the antenna pattern, and the lower end thereof is formed as a sharp cutting edge.

FIG. 6 illustrates an enlarged view of the RFID in which the semiconductor chip 2 is mounted. Since the resin layer 11 is removed through the process (C) shown in FIG. 2, there is a gap between the semiconductor chip 2 and the metal foil 12. When a higher bonding reliability is required, it is recommended to fill this gap with a resin.

[Embodiment 3]

The embodiment 1 and the embodiment 2 adopt the use of a PET film or a PEN film, but this embodiment employs a sheet of paper instead.

Except for replacing the PET film 13 in the embodiment 1 and the embodiment 2 by paper, the other components and constructions are the same.

However, the paper does not have a glass transition temperature, and the ambient temperature in the process must be a temperature that does not cause a deformation or burning of the paper. Therefore, it is preferable that the ambient temperature is the room temperature, from the point of view of not requiring the provision of a special heating device.

[Embodiment 4]

FIG. 1 illustrates a perspective view of the RFID. The RFID 1 consists of a semiconductor chip 2, a metal foil laminated member 10, and a resin layer 11 serving as a cover layer and an etching resist layer. The semiconductor chip 2 is formed in a square shape with 400 μm on each side, and it is provided with four circular gold bumps on the device side, the pitch of which is 300 μm and the diameter of which is about 60 μm.

The metal foil laminated member 10 is composed of a metal foil (aluminum foil) 12 and a PET film 13, and the aluminum foil 12 is bonded to the PET film 13. The aluminum foil 12 is fabricated into a form capable of transmitting and receiving the radio waves at the frequency of 2.45 GHz in the microwave band, or radio waves of the frequency 800 MHz~950 MHz in the UHF band, or radio waves of both frequencies. The PET film 13 is the base material of the metal foil, and it is formed by extending a polyethylene terephthalate material. And, the metal foil 12 is configured in the shape of a rectangle provided with an L-letter shaped gap.

FIG. 4 illustrates the state of this bonding. The metal bumps 3 are electrically connected to the metal foil 12. The resin layer 11 surrounds the gold bumps 3 of the semiconductor chip 2.

FIG. 2 and FIG. 3 illustrate the manufacturing flow of this RFID.

The RFID illustrated in FIG. 1 is manufactured according to the following order of processes: (A) a process for the manufacture of the metal foil laminated member, (B) a resin layer forming process, (C) a process for the manufacture of the antenna pattern, (D) an ultrasonic applying process, and (E) an inlet individualizing process.

(A) Process for the Manufacture of the Metal Foil Laminated Member

First, it is necessary to prepare an aluminum foil 12 with a thickness of 20 μm and a PET film 13 with a thickness of 25 μm.

Next, the process disposes the aluminum foil 12 on one side (on the upper side in the drawing) of the PET film 13 with an adhesive disposed between them, and it applies a temperature of 150° C. and a linear pressure of 1 kg/cm to the adhered lamination, thereby forming the metal foil laminated member 10 in which the metal foil is adhered to the PET film.

(B) A Resin Layer Forming Process

This process forms the resin layer 11 having a thickness of about 0.5~3 μm on the surface of the aluminum foil 12 of the metal foil laminated member 10 that was fabricated in the process (A). The resin layer 11 is fabricated to have a required antenna pattern by means of photogravure. The material for this resin layer 11 is one that functions as a resist layer when the next process etches the aluminum foil 12.

This resin layer 11 also may be formed by means of the so-called general photo etching method that coats a photo-coagulative resin, cures the photo-coagulative resin with a mask into a specific pattern, and removes the remainder except for the specific pattern, instead of forming the pattern on the surface of the aluminum foil 12 of the metal foil laminated member 10 by means of photogravure. Here, the thickness of this coating is controlled according to the size or shape of the bumps of the chip to be mounted.

Although it is not adopted in this embodiment, another method is conceivable in which the PET film 13 is provided with sprocket perforations in the antenna pattern of the resin layer 11, or provides it in advance, and then forms the pattern of the resin layer 11 between the sprocket perforations. This method will permit a reel-to-reel production. Here, in case of forming the sprocket perforations in this process, it is preferable to form two rows of the resin layer 11 independent from the antenna pattern, so as to put in the pattern of the resin layer 11, and to punch the metal foil laminated member 10 from the side of the resin layer 11 using a puncher. This is because the resin layer 11 functions as a lubricant for the cutting edge of the puncher.

(C) Process for the Manufacture of the Antenna Pattern

Next, the etching treatment removes the area of the aluminum foil, being the part that is exposed from the resist layer of the antenna pattern of the resin layer 11. This etching forms the antenna. This etching is carried out, for example, by soaking the area of the aluminum foil that is exposed from the etching resist pattern 7 in a hydrochloric acid or ferric chloride solution, serving as being the etching liquid, under temperature of 50° C.

(D) Ultrasonic Applying Process

First, this process aligns the semiconductor chip 2 at a predetermined position relative to a laminated structure of the resin layer 11 and the metal foil laminated member 10 in which the antenna pattern of the metal foil 12 is formed on the PET film 13 as the base material.

In this embodiment, the alignment is effected in a manner such that the center of the semiconductor chip 2 coincides with the corner of the L-letter shaped gap 14 formed on the metal foil 12 and the resin layer 11. That is, the structure is in a form such that the gap 14 is disposed between the four gold bumps 3. When arranging the signal bumps in a slant direction, and arranging one signal bump in the joint area of the gold bumps 3 in which two sides thereof are surrounded by the gap, this configuration secures electrical connections even if the other signal bump is dislocated slightly, thus increasing the margin of the alignment.

Next, the process presses the gold bumps 3 to the resin layer 11 with a specific pressure, puts a square horn 4 with 500 μm on each side on the upper side of the semiconductor chip 2, and applies ultrasonic waves 5 to the side of the semiconductor chip 2 where the gold bumps are not present.

By the application of ultrasonic vibrations, the gold bumps 3 displace the resin layer 11, so that the bumps come into contact and join with the aluminum foil 12. The temperature setting in this process is the room temperature, which is lower than the glass transition temperature of the PET film 13. And, the ultrasonic waves at a frequency of 63.5 KHz are applied at an output power of 1.2 Watts for about 0.5 second under a pressure of 0.2 Kg-wt.

Although this embodiment applies the ultrasonic waves at room temperature, so long as the ambient temperature in the process is lower than the glass transition temperature, heating at that temperature will not cause any difficulties.

Further, in order to attain a desired fastness, it is recommended to fill or coat a thermo-setting resin to surround the semiconductor chip 2 to achieve a thermal hardening.

(E) Inlet Individualizing Process.

This process individualizes the RFID (at least the structure composed of the RFID chip and the antenna) mounting the semiconductor chip 2, by lowering the metal frame 20 from above the resin layer 11. Here, the size of the metal frame 20 is virtually the same as the size of the pattern of the resin layer 11 or the metal foil 12, namely, the antenna pattern, and the lower end thereof is formed as a sharp cutting edge.

This embodiment employs the PET film 13 as the base material of the laminated member 1. However instead of employing the PET film 13, it is possible to employ a PEN (polyethylene naphthalate) film (film formed by extending a polyethylene naphthalate). In this case, the glass transition temperature of the general polyethylene naphthalate is about 100° C.~120° C., and the ambient temperature should be lower than this temperature.

The embodiment being thus described, when the antenna of an aluminum system (aluminum or aluminum alloy) metal foil is formed on the base material including a material such as PET film, PEN film, or paper, (including the case in which the base material is composed of plural layers, and these materials are used in any one of the layers), the method of this embodiment is designed to mount a semiconductor chip on the aluminum system metal foil at a temperature lower than the deformable temperature, such as the glass transition temperature, of the base material, and with a desired pressure. That is, the method of this embodiment does not adopt the ultrasonic bonding technique under the conventional heating and pressurization conditions; accordingly, this method is able to suppress the deformation of the antenna, and to achieve a secure bonding.

[Embodiment 5]

Another embodiment is shown in FIG. 5 and FIG. 6.

The process (C) of the embodiment 4 leaves the resin layer 11 of the antenna pattern as it is, but this embodiment removes the resin layer 11, as shown in FIG. 5 and FIG. 6. To remove it, this process employs the method of soaking the part of the resin layer 11 in a resist removing solution, by which the resin layer 11 falls away from the antenna pattern. This method makes it possible to manufacture a structure in which only the resin layer 11 of FIG. 1 is absent.

Thus, the manufacturing processes (C)~(E) are replaced by the following processes (C')~(E').

(C') Process for the Manufacture of the Antenna Pattern

The etching treatment removes the area of the aluminum foil, being the part that is exposed from the resist layer of the antenna pattern of the resin layer 11. This etching forms the antenna. The etching is carried out, for example, by soaking the area of the aluminum foil that is exposed from the etching resist pattern 7 in a hydrochloric acid or ferric chloride solution, serving the etching liquid, at a temperature of 50° C.

Thereafter, the pattern of the resin layer 11, having functioned as the resist layer, is removed by using a resist remover.

(D') Ultrasonic Applying Process

First, this process aligns the semiconductor chip 2 at a predetermined position relative to the metal foil laminated member 10 in which the antenna pattern of the metal foil 12 is formed on the PET film 13 as the base material.

In this embodiment, the alignment is effected in a manner such that the center of the semiconductor chip 2 coincides with the corner of the L-letter shaped gap 14 formed on the metal foil 12. That is, the structure is made in a form such that the gap 14 is disposed between the four gold bumps 3. When arranging the signal bumps in a slant direction, and arranging one signal bump in the joint area of the gold bumps 3 in which two sides thereof are surrounded by the gap, this configuration secures the electrical connections even if the other signal bump is dislocated slightly, thus increasing the margin of the alignment.

Next, the process presses the gold bumps 3 to the metal foil 12 with a specific pressure, puts a square horn 4 with 500 μm on each side on the upper side of the semiconductor chip 2, and applies ultrasonic waves 5 to the side of the semiconductor chip 2 where the gold bumps are not present.

By the ultrasonic vibrations, the gold bumps 3 displace the resin layer 11, so that the bumps come into contact and join with the aluminum foil 12. The temperature setting in this process is the room temperature, which is lower than the glass transition temperature of the PET film 13. And, the ultrasonic waves at a frequency of 63.5 KHz are applied at an output power of 1 Watt for about 0.5 second under a pressure of 0.2 Kg-wt.

Although this embodiment applies the ultrasonic waves at room temperature, so long as the ambient temperature is lower than the glass transition temperature, heating at that temperature will not cause any difficulties.

(E') Inlet Individualizing Process.

This process individualizes the RFID (at least the structure composed of the RFID chip and the antenna) mounting the semiconductor chip 2, by lowering the metal frame 20 from above the metal foil 12. Here, the size of the metal frame 20 is virtually the same as the size of the pattern of the metal foil 12, namely, the antenna pattern, and the lower end thereof is formed as a sharp cutting edge.

FIG. 6 illustrates an enlarged view of the RFID in which the semiconductor chip 2 is mounted.

Since the resin layer 11 is removed through the process (C) shown in FIG. 2, there is a gap between the semiconductor chip 2 and the metal foil 12. When a higher fastness is required, it is recommended to fill or coat a thermo-setting resin to surround the gap and the semiconductor chip 2 to achieve a thermal hardening.

[Embodiment 6]

The embodiment 4 and the embodiment 5 adopt the use of a PET film or a PEN film, but this embodiment employs a sheet of paper instead.

Accompanied with the replacement of the PET film 13 in the embodiment 4 and the embodiment 5 by paper, it is preferable to use punching by a metal mold in forming the metal foil 12.

However, the paper does not have a glass transition temperature, and the ambient temperature in the process must be a temperature that does not cause a deformation or burning of the paper. Therefore, it is preferable that the ambient temperature is the room temperature, from the point of view of not requiring the provision of a special heating device.

What is claimed is:

1. A method of manufacturing an RFID in which a semiconductor chip with a memory is bonded to an antenna, and information recorded in the memory is transmitted through the antenna, the method comprising the steps of:
    aligning the semiconductor chip with gold bumps to the antenna in which a metal foil formed of aluminum or an aluminum alloy is adhered to a base material including a polyethylene terephthalate or a polyethylene naphthalate; and
    pressing the semiconductor chip to the antenna, and applying ultrasonic waves under an ambient temperature lower than the glass transition temperature of the polyethylene terephthalate or the polyethylene naphthalate to thereby bond the gold bumps and the metal foil.

2. A method of manufacturing an RFID in which a semiconductor chip with a memory is bonded to an antenna, and information recorded in the memory is transmitted through the antenna, the method comprising the steps of:
    adhering a metal foil formed of an aluminum foil or an aluminum alloy foil to a base material formed of a polyethylene terephthalate or a polyethylene naphthalate;
    forming a resin layer having a pattern required for the antenna on a surface of the metal foil;
    removing an area of the metal foil exposed from the resin layer by etching the area of the metal foil using the resin layer as a resist to form the antenna so that the resin layer remains on a surface of the antenna;
    aligning the semiconductor chip with gold bumps to the antenna which is formed of the metal foil adhered to the base material; and
    pressing the semiconductor chip to the resin layer, and applying ultrasonic waves under an ambient temperature lower than the glass transition temperature of the polyethylene terephthalate or the polyethylene naphthalate to bond the gold bumps to the antenna through the resin layer.

3. A method of manufacturing an RFID according to claim 1 or claim 2, wherein the ultrasonic waves are applied under a room temperature.

4. A method of manufacturing an RFID in which a semiconductor chip with a memory is bonded to an antenna, and information recorded in the memory is transmitted through the antenna, the method comprising the steps of:
    aligning the semiconductor chip with gold bumps to the antenna in which a metal foil formed of aluminum or an aluminum alloy is adhered to a base material including a sheet of paper; and
    pressing the semiconductor chip to the metal foil, and applying ultrasonic waves under a room temperature to thereby bond the gold bumps and the metal foil.

5. A method of manufacturing an RFID in which a semiconductor chip with a memory is bonded to an antenna, and information recorded in the memory is transmitted through the antenna, the method comprising the steps of:
    adhering a metal foil formed of an aluminum foil or an aluminum alloy foil to a base material formed of a sheet of paper;
    forming a resin layer having a pattern required for the antenna on a surface of the metal foil;

removing an area of the metal foil exposed from the resin layer by etching the area of the metal foil using the resin layer as a resist to form the antenna so that the resin layer remains on a surface of the antenna;

aligning the semiconductor chip with gold bumps to the antenna which is formed of the metal foil adhered to the base material; and pressing the semiconductor chip to the antenna through the resin layer, and applying ultrasonic waves under a room temperature lower than 60° C. to bond the gold bumps to the antenna through the resin layer.

6. A method of manufacturing an RFID according to claim 2, wherein the resin layer is a photo-coagulative resin, which is cured in the pattern required for the antenna on the surface of the metal foil in the step for forming the resin layer.

7. A method of manufacturing an RFID according to claim 6, wherein the step for forming the resin layer includes a step for coating the surface of the metal foil with the photo-coagulative resin, a step for curing the photo-coagulative resin with a mask into the pattern required for the antenna, and a step for removing a remainder of the photo-coagulative resin except for an area thereof cured into the pattern required for the antenna.

8. A method of manufacturing an RFID according to claim 2, wherein the ultrasonic waves are applied to a side of the semiconductor chip opposite to another side thereof where the gold bumps are provided, so that ultrasonic vibrations by the ultrasonic waves make the gold bumps displace the resin layer on the antenna to come into contact and join with the antenna.

9. A method of manufacturing an RFID according to claim 2, further comprising a step for filling or coating a thermosetting resin surrounding the semiconductor chip and a step for thermal hardening the thermosetting resin filling or coating around the semiconductor chip.

10. A method of manufacturing an RFID according to claim 2, wherein each of the antenna and the resin layer is shaped to have a gap formed in a surface of the base material formed, each of the gaps exposes a part of the surface of the base material and is located under the semiconductor chip.

11. A method of manufacturing an RFID according to claim 10, wherein the gap is put between the gold bumps of the semiconductor chip each connected to the antenna through the resin layer.

12. A method of manufacturing an RFID according to claim 2, wherein the base material is formed of the polyethylene terephthalate having the glass transition temperature in a range from 60° C.–80° C.

13. A method of manufacturing an RFID according to claim 12, wherein the ambient temperature during the step for applying the ultrasonic waves is lower than 60° C.

14. A method of manufacturing an RFID according to claim 2, wherein the base material is formed of the polyethylene naphthalate having the glass transition temperature in a range from 100° C.–120° C.

15. A method of manufacturing an RFID according to claim 14, wherein the ambient temperature during the step for applying the ultrasonic waves is lower than 100° C.

16. A method of manufacturing an RFID according to claim 1, wherein the base material is formed of the polyethylene terephthalate having the glass transition temperature in a range from 60° C.–80° C.

17. A method of manufacturing an RFID according to claim 16, wherein the ambient temperature during the step for applying the ultrasonic waves is lower than 60° C.

18. A method of manufacturing an RFID according to claim 1, wherein the base material is formed of the polyethylene naphthalate having the glass transition temperature in a range from 100° C.–120° C.

19. A method of manufacturing an RFID according to claim 18, wherein the ambient temperature during the step for applying the ultrasonic waves is lower than 100° C.

* * * * *